(12) United States Patent
Lee

(10) Patent No.: US 7,280,379 B2
(45) Date of Patent: Oct. 9, 2007

(54) CAM DEVICE AND METHOD FOR REPAIRING THE SAME

(75) Inventor: In-Youl Lee, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/431,244

(22) Filed: May 9, 2006

(65) Prior Publication Data
US 2006/0256600 A1 Nov. 16, 2006

(30) Foreign Application Priority Data
May 10, 2005 (KR) .................... 10-2005-0038783

(51) Int. Cl.
*G11C 7/00* (2006.01)
(52) U.S. Cl. .................... 365/49; 365/201
(58) Field of Classification Search .............. 365/49, 365/201
See application file for complete search history.

(56) References Cited

U.S. PATENT DOCUMENTS 3,324,985 A * 6/1967 Palmer et al. .......... 400/164.2
3,532,863 A * 10/1970 Enslein et al. .............. 702/182
6,275,426 B1 8/2001 Srinivasan et al.
6,445,628 B1 9/2002 Pereira et al.
2007/0019455 A1 * 1/2007 Lysinger ...................... 365/49

* cited by examiner

*Primary Examiner*—Michael T Tran
(74) *Attorney, Agent, or Firm*—F. Chau & Assoc., LLC

(57) ABSTRACT

A content addressable memory (CAM) device is provided that includes a primary cell array having at least one entry in which a plurality of CAM cells are connected to word lines and match lines, a redundant cell array having entries formed in the same structure as that of the entries in the primary cell array to substitute for a defective entry including one or more defective CAM cells in the primary cell array, an encoder for receiving a match signal from an entry in the CAM array block having data matching search data to generate final entry information, and an entry controlling circuit for determining whether each entry in the CAM array block is used to generate the final entry information at the encoder, and inhibiting a signal applied from a match line of the defective entry from participating in generating the final entry information at the encoder.

20 Claims, 6 Drawing Sheets

CAM DEVICE AND METHOD FOR REPAIRING THE SAME

CROSS-REFERENCE TO RELATED APPLICATION

This application claims the benefit of Korean Patent Application No. 10-2005-0038783, filed May 10, 2005, the disclosure of which is incorporated by reference herein in its entirety.

BACKGROUND OF THE INVENTION

1. Technical Field

The present invention relates to semiconductor memory devices, and more particularly, to a content addressable memory (CAM) device and a method for repairing the CAM device.

2. Discussion of Related Art

In a random access memory (RAM) or a read only memory (ROM), an address is input to read data that is stored in a memory cell designated by the address. However, in a content addressable memory (CAM) device, external data is received and compared to stored data to determine whether it matches the stored data, and a signal corresponding to the comparing result is output. The signal corresponding to the comparing result may be in an address, pointer, or bit pattern form, which is referred to as "entry information".

In the CAM device, each of the CAM cells includes a comparing circuit. External data input to the CAM device is compared to data stored in all the CAM cells, and the compared and output entry information becomes a result of a search operation. The CAM device is widely used as a tag memory for storing an address of a cache memory needing a high operation speed. Further, since the CAM device may be used to perform an address search, it is widely utilized to search a destination IP address in an Internet router.

CAM devices may be classified into binary CAMs and ternary CAMs depending on the characteristics of a CAM cell.

The binary CAM generally includes RAM cells each storing one of two logic states of data "1" and data "0". The binary CAM further includes a comparing circuit. The comparing circuit compares external data (data for a search operation, hereinafter referred to as search data) to data stored in the RAM cell. If the search data matches the data stored in the RAM cell, the comparing circuit makes a corresponding match line at a certain logic state. Examples of the binary CAM are disclosed in U.S. Pat. Nos. 4,646,271 and 5,495,382.

The ternary CAM can store any one of three logic states, i.e., 0, 1 and don't care state. Examples of the ternary CAM are disclosed in U.S. Pat. Nos. 6,731,526 and 6,747,885.

In a read/write operation or a search operation of the CAM device, specific defective ones of a plurality of CAM cells constituting the CAM device may cause an error. Further, the defective cells may disable the operation of the CAM.

Other semiconductor memory devices having no search operation mode (e.g., SRAM and DRAM) generally include a redundant cell array substituting for the defective cell, in which data is stored in cells of the redundant cell array instead of the defective cells.

Conversely, since the CAM device has a search operation mode, factors other than the repair of other semiconductor memory devices having no search operation mode can be considered. That is, a unique repairing method can be used.

There are, several methods for repairing a CAM device. Examples of the repair methods are disclosed in U.S. Pat. Nos. 6,445,628 and 6,275,406. Hereinafter, an example of a conventional method for repairing a CAM device will be described with reference to FIG. 1.

FIG. 1 is a block diagram illustrating an example of a method for repairing a conventional CAM device.

Referring to FIG. 1, a CAM array 10 in the CAM device includes a primary cell array 14, a primary encoder 24, a redundant cell array 12, and a redundant encoder 22.

The primary cell array 14 includes a plurality of entries E2, E4, E6, E8, E10, . . . , E12. Each of the primary entries E2 to E12 includes a plurality of CAM cells (not shown) for storing data. For example, the primary entry E2 includes a plurality of CAM cells that can store data bits such as 16 bits, 32 bits, 64 bits, and 128 bits. Each of the primary entries E2 to E12 is accessed as a primary address is input. In the primary cell array 14, L primary addresses are required to access L entries.

The redundant cell array 12 includes a plurality of redundant entries RE2, RE4, . . . , RE6. Each of the redundant entries RE2 to RE6 includes a plurality of CAM cells (not shown) for storing data. The redundant entries RE2 to RE6 store data in place of defective entries (including one or more defective cells) in the primary cell array 14. Each of the redundant entries RE2 to RE6 is accessed as a redundant address is input, similarly to the primary entries E2 to E12. In the redundant cell array 12, R redundant addresses are required to access R entries.

When one or more CAM cells in the primary cell array 14 are defective, primary entries including the defective cells may not be used to store data. For example, when the primary entries E8 and E10 respectively include defective cells DC1 and DC2, they may not be used to store data for operation of the CAM device. Here, the non-used primary entries E8 and E10 are defective entries. To store the data that is intended to be stored in the defective entries E8 and E10, the redundant entries RE4 and RE6 are activated instead of the defective entries E8 and E10.

The CAM device further includes a first address mapper 18, a fuse bank 30, a second address mapper 28, and a secondary encoder 26.

The fuse bank 30 stores addresses of the defective entries E8 and E10, which are the entries including the defective cells DC1 and DC2, and addresses of corresponding redundant entries so that entry information P_ADD generated by the primary encoder 24 and entry information R_ADD generated by the redundant encoder 22 are used for mapping.

For example, when the redundant entry RE4 is substituted for the defective entry E8 and the redundant entry RE6 is substituted for the defective entry E10, the addresses of the defective entries E8 and E10 and the corresponding redundant entries RE4 and RE6 are stored in the fuse bank 30. Here, the fuse bank 30 is fused by several methods to store addresses for address mapping. The fuse bank 30 is connected to the first and second address mappers 18 and 28 to provide the addresses stored in the fuse bank 30.

In read/write operation modes of the CAM device, the first address mapper 18 receives an n-bit read/write address R/W_ADD to perform read or write operation on the entries in the primary cell array 14. To determine whether the input read/write address R/W_ADD matches the addresses of the defective entries E8 and E10, the first address mapper 18 accesses the addresses of the defective entries E8 and E10 stored in the fuse bank 30. If the input read/write address R/W_ADD matches the addresses of the defective entries E8 and E10 stored in the fuse bank 30, the first address mapper 18 accesses the addresses of the redundant entries RE4 and RE6. The defective entries E8 and E10 are not read or written. Meanwhile, if the input read/write address R/W_ADD does not match the addresses of the defective entries E8 and E10 stored in the fuse bank 30, the read/write address R/W_ADD is sent to the CAM array 10 so that a primary entry designated by the read/write address R/W_ADD is accessed. The first address mapper 18 provides an (n+1)-bit address that is one-bit greater than an n-bit input address to the CAM array 10. One extra bit is provided to select one of the primary cell array 14 and the redundant cell array 12.

In the search operation mode of the CAM device, search data S_DATA is input to the CAM device, buffered by the search driver 16, and input to the CAM array 10. If the search data S_DATA is input to the CAM array 10, an entry storing data having the same pattern as the search data S_DATA is searched and a search result is sent to the encoder. If there are no defective entries, the redundant cell array 12 and thus the redundant encoder 22 are not used. However, when the defective entries E8 and E10 exist as shown in FIG. 1, the primary encoder 24 and the redundant encoder 22 may be both used. The primary encoder 24 and the redundant encoder 22 receive one or more search results from the primary cell array 14 and the redundant cell array 12, respectively. The data having the same pattern as the search data S_DATA may not exist in both the primary cell array 14 and the redundant cell array 12. In this case, a search result is not provided to both the primary encoder 24 and the redundant encoder 22. If the primary encoder 24 or the redundant encoder 22 receives two or more search results, the primary encoder 24 or the redundant encoder 22 outputs entry information P_ADD and R_ADD having the highest priority according to a defined priority.

In the search operation mode of the CAM device, when external search data S_DATA is provided and a search operation is performed, the CAM device searches entries that store data matching the search data from the primary cell array 14 or the redundant cell array 12. The result of a search in the primary cell array 14 or the redundant cell array 12 is provided to the primary encoder 24 or the redundant encoder 22. The entry information R_ADD generated by the redundant encoder 22 is loaded on a redundant entry information bus 32 and provided to the second address mapper 28. The second address mapper 28 maps the entry information R_ADD generated by the redundant encoder 22 to corresponding primary entry information (i.e., an address, pointer, or bit pattern of the defective entry). The primary entry information mapped to the entry information R_ADD generated by the redundant encoder 22 is provided to the secondary encoder 26. Further, the secondary encoder 26 receives entry information P_ADD on the primary entry information bus 34. The secondary encoder 26 outputs, via a result bus 36, final entry information E_RESULT 36 that is one of the primary entry information mapped to the entry information R_ADD and the entry information P_ADD sent by the primary entry information bus 34 according to the defined priority.

In the CAM device using the above-described repairing method, however, the defective entry participates in generating entry information at the primary encoder and unintended final entry information is output when search data match specific pattern data of the defective entry, due to a characteristic caused by a latch structure of a cell of a primary cell array, i.e., a characteristic of maintaining specific pattern data, even after substitution and repair into an entry in the redundant cell array so a defective entry does not participate in generating entry information.

Further, an example of conventional CAM devices includes a CAM device having an entry valid bit (EVB). The entry valid bit is for determining whether each entry in the primary cell array and the redundant cell array is used to generate final entry information. In particular, the CAM device having the entry valid bit can support a function of extending a search width in an Internet Protocol (IP) system of IPv6. Corresponding to such an extension of the search width, a CAM device having an EVB that realizes a function of determining whether to use the entry is expected to be propagated.

In the CAM device including the EVB, a defective entry does not participate in generating entry information at a primary encoder when an entry in a redundant cell array is substituted for a defective entry and the EVB is programmed to indicate that the entry in the redundant cell array substituting for the defective entry is valid. However, as the CAM cell of the primary cell array is formed in a latch structure, the defective entry participates in generating entry information at the primary encoder, which causes an operation error in the CAM device.

SUMMARY OF THE INVENTION

Therefore, the present invention is directed to provide a content addressable memory (CAM) device and a method for repairing the CAM device, capable of addressing difficulties caused by the latch structure of a cell in a primary cell array.

An exemplary embodiment of the present invention provides a content addressable memory (CAM) device comprising a first cell array having at least one entry in which a plurality of CAM cells are connected to word lines and match lines, a second cell array having entries formed in the same structure as that of the entries in the first cell array to substitute for entries including one or more defective CAM cells in the first cell array, an encoder for receiving match signals from entries having data matching search data to generate final entry information in a search operation, and an entry controlling circuit for determining whether each entry in the first and second cell arrays is used to generate the final entry information at the encoder, and inhibiting signals applied from match lines of the entries including the defective CAM cells from participating in generating the final entry information at the encoder.

The encoder may comprise a first encoder for receiving the match signals from the match entries in the first cell array having the data matching the search data to generate first entry information; and a second encoder for receiving match signals from the match entries in the second cell array having data matching the search data to generate second entry information.

The first and second encoders may respectively generate the first and second entry information based on the match signal from the entry having a higher priority according to a defined entry priority when two or more match entries exist in the first and second cell arrays.

The entry controlling circuit may comprise control cells each assigned to each entry in the first and second cell arrays, and the control cell comprises a latch that stores entry select data for determining whether the entries in the first and second cell arrays are used to generate the entry information at the encoder.

The entry controlling circuit may comprise a bit line for applying the entry select data. The entry controlling circuit may comprise a reset signal line that enables the entries in the first and second cell arrays to be reset. The reset state may be that the match line of the entry becomes a ground voltage level.

The CAM device may comprise a redundant encoder enabling unit for enabling the second encoder when the entries in the second cell array are substituted for one or more entries in the first cell array.

An exemplary embodiment of the present invention provides a CAM device comprising a CAM array block including a primary cell array having at least one entry in which a plurality of CAM cells are connected to word lines and match lines, and a redundant cell array having entries formed in the same structure as that of the entries in the primary cell array to substitute for entries including one or more defective CAM cells in the primary cell array, an encoder for receiving a match signal from an entry in the CAM array block having data matching search data to generate final entry information, and an entry controlling circuit for determining whether each entry in the CAM array block is used to generate the final entry information at the encoder, and inhibiting a signal applied from a match line of the defective entry from participating in generating the final entry information at the encoder.

The CAM array block may comprise two or more CAM array blocks.

After search data is applied to a search signal line and a data comparison operation is performed on the entries in the CAM array block and before a result of the data comparison operation is applied to the match line, the match line may become a ground voltage level in response to a reset signal applied to the control cell.

An exemplary embodiment of the present invention provides a method for repairing a CAM device, the CAM device comprising a primary cell array having at least one entry in which a plurality of CAM cells are connected to word lines and match lines, a redundant cell array including entries having the same structure as that of the entries in the primary cell array to substitute for an entry including one or more defective CAM cells in the primary cell array, and an encoder, the method comprising substituting an entry in the redundant cell array for the entry including the defective CAM cells, applying a reset signal to each entry in the primary and redundant cell arrays prior to applying search data to the CAM device to inhibit a signal on a match line of the entry including the defective CAM cells from participating in generating final entry information at the encoder, and allowing signals on match lines of entries other than the entry including defective CAM cells to participate in generating the final entry information at the encoder.

The method may further comprise determining whether each entry in the primary and redundant cell arrays is used to generate the final entry information at the encoder.

Applying a reset signal may comprise making a match line of each entry be at a ground voltage.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF EXEMPLARY EMBODIMENTS

Figure 1:
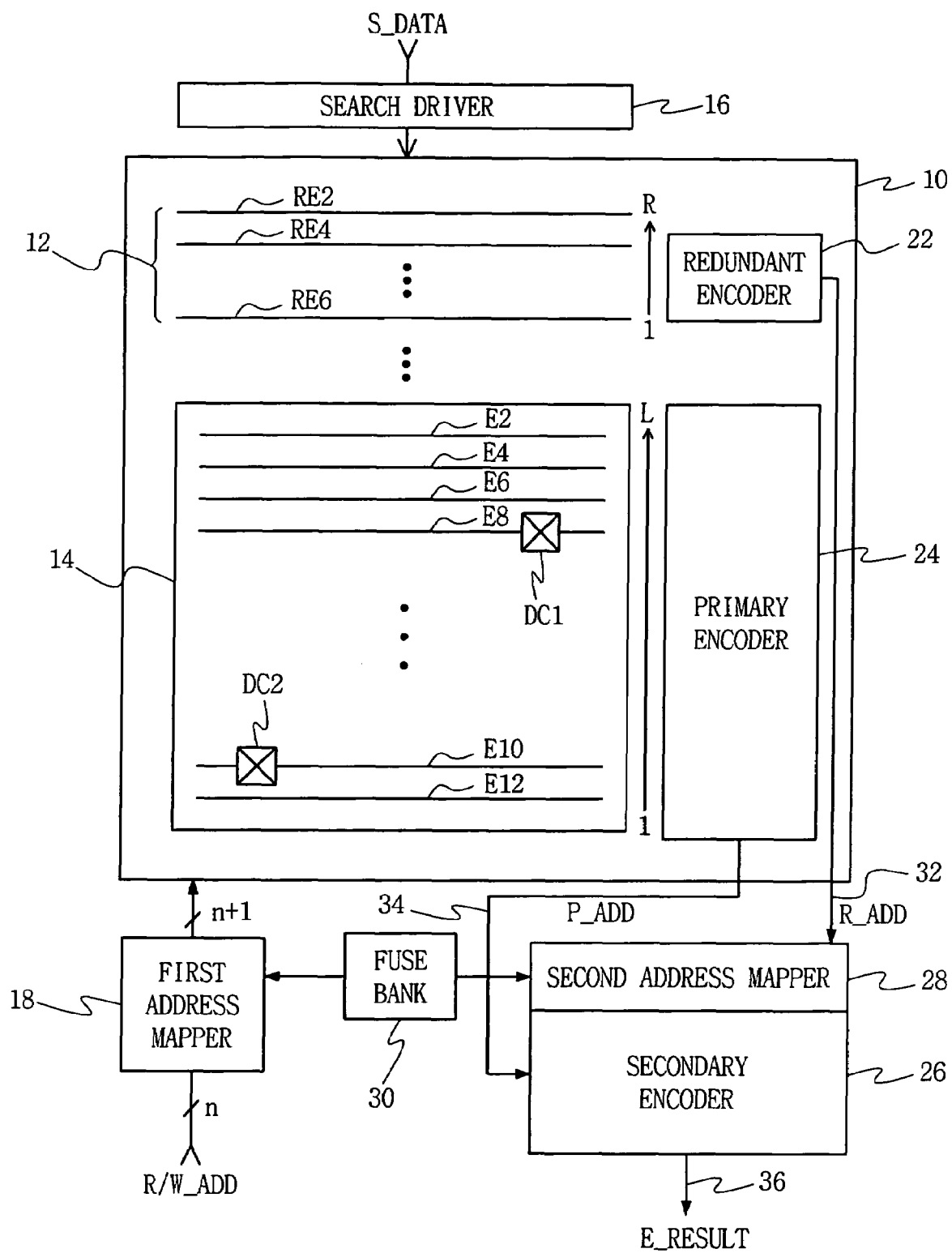
FIG. 1 is a block diagram illustrating an example of a method for repairing a conventional content addressable memory (CAM) device.

The present invention will now be described with reference to the accompanying drawings, in which exemplary embodiments of the invention are shown. However, the invention should not be construed as limited to the embodiments set forth herein. In the drawings, like numbers refer to like elements.

Figure 2:
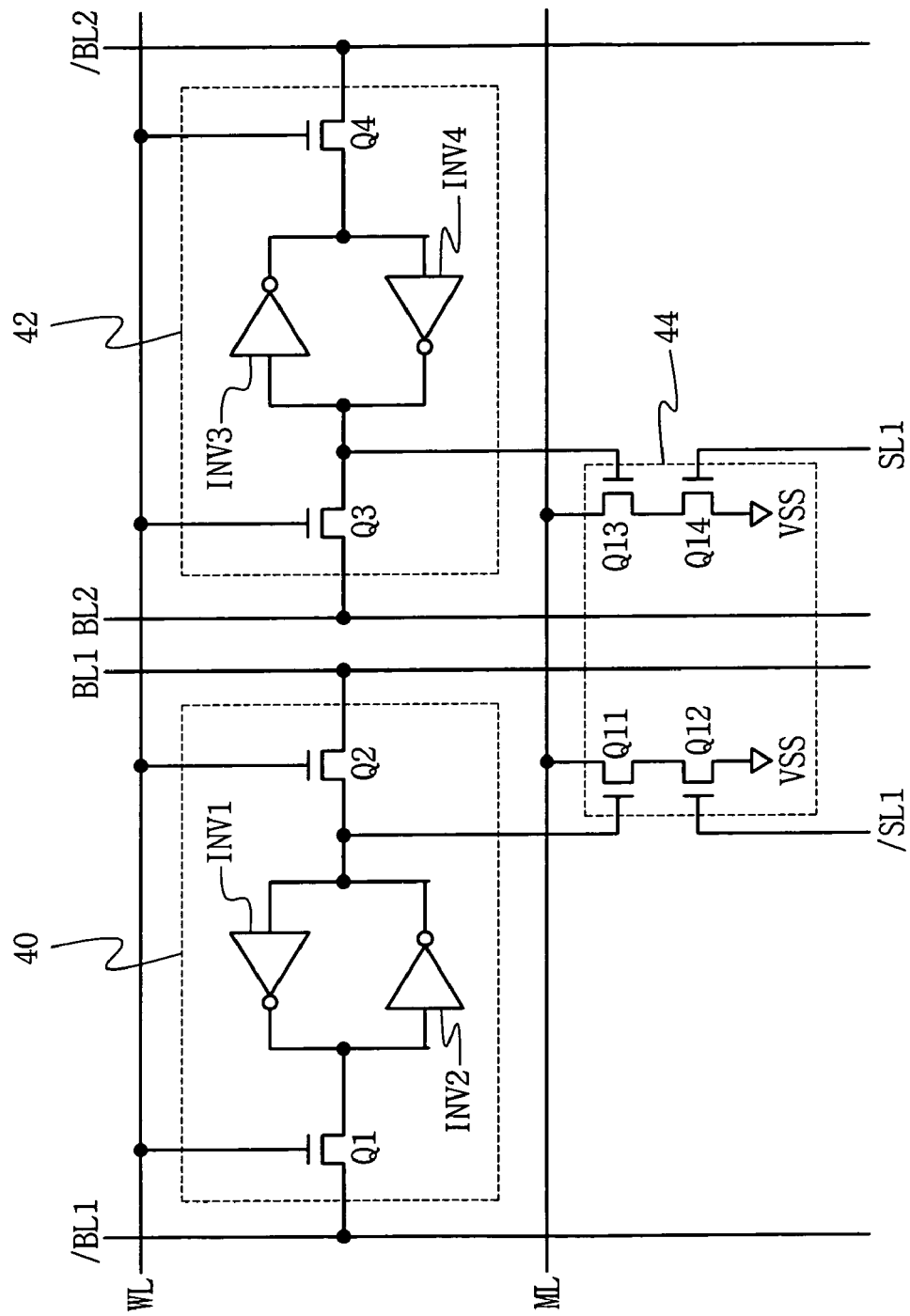
FIG. 2 is a circuit diagram illustrating a conventional ternary CAM cell.

FIG. 2 is a circuit diagram illustrating a conventional ternary CAM cell. Since the ternary CAM cell in FIG. 2 may be an example of a CAM cell applied to the CAM device of the present invention, it will be described in greater detail.

Referring to FIG. 2, the ternary CAM cell includes SRAM cells 40 and 42 for storing data, and a comparing circuit 44.

The SRAM cell 40 includes a latch circuit including two inverters INV1 and INV2, and access transistors Q1 and Q2 each having a gate connected to a word line WL and transmitting data on bit lines BL1 and /BL1 to the latch.

Similarly, the SRAM cell 42 includes a latch circuit including two inverters INV3 and INV4, and access transistors Q3 and Q4 each having a gate connected to the word line WL and transmitting data on bit lines BL2 and /BL2 to the latch.

The comparing circuit 44 includes comparing transistors Q11, Q12, Q13 and Q14.

The comparing transistors Q11 and Q12 are connected in series. A match line ML is connected to the drain of the comparing transistor Q11 and a ground voltage Vss is applied to the source of the comparing transistor Q12. The gate of the comparing transistor Q11 is connected to an output of the inverter INV2 in the SRAM cell 40, and the gate of the comparing transistor Q12 is connected to an inverted search line /SL1.

Similarly, the comparing transistors Q13 and Q14 are connected in series to each other. The drain of the comparing transistor Q13 is connected to the match line ML and a ground voltage Vss is applied to the source of the comparing transistor Q14. The gate of the comparing transistor Q13 is connected to an output of the inverter INV3 in the SRAM cell 42 and the gate of the comparing transistor Q14 is applied to a search line SL1.

Searching operation and comparing operation of the ternary CAM cell will be now described. The match line ML is initially precharged to a high voltage and the search data is load on the pair of search lines SL1 and /SL1. If the search data does not match the data stored in the SRAM cell 40, the voltage level at the match line ML is changed. That is, the data stored in the SRAM cell 40 mismatches the search data, the voltage at the match line ML is changed to a low voltage. However, if the data stored in the SRAM cell 40 matches the search data, the voltage at the match line ML is kept at the high voltage.

For example, it is assumed that data "1" is applied to the bit line BL1 to be stored and kept in the SRAM cell 40, data "0" is applied to the bit line BL2 to be stored and kept in the SRAM cell 42, data "0" is applied to the search line SL1, and data "1" is applied to the inverted search line /SL1. This is a state in which the data stored in the SRAM cell 40 is different from the data applied to the search line SL1, i.e., a mismatch state. At this time, data "1" is applied to the gate of the comparing transistor Q11 so that the comparing transistor Q11 is activated. The data "1" applied to the inverted search line /SL1 is applied to the gate of the comparing transistor Q12 so that the comparing transistor Q12 is activated. Since the comparing transistors Q11 and Q12 are connected in series, a current path is formed and the match line ML is discharged. Accordingly, the voltage at the match line ML is changed to a low voltage. That is, it means that the data stored in the SRAM cell 40 mismatches the search data.

On the other hand, it is assumed that data "1" is applied to the bit line BL1 to be stored in the SRAM cell 40, the data "0" is applied to bit line BL2 to be applied in the SRAM cell 42, data "1" is applied to the search line SL1, and data "0" is applied to the inverted search line /SL1. This is a match state. At this time, data "1" is applied to the gate of the comparing transistor Q11 so that the comparing transistor Q11 is activated. The data "0" on the inverted search line /SL1 is applied to the gate of the comparing transistor Q12 so that the comparing transistor Q12 is deactivated. Since the comparing transistors Q11 and Q12 are connected in series, a current path for discharging the match line ML is not formed. Similarly, data "0" is applied to the gate of the comparing transistor Q13 so that the comparing transistor Q13 is deactivated. Thus, in the match state, since the current path for discharging the match line ML is not formed, the voltage on the match line ML is kept as a high voltage.

Meanwhile, when data "0" is stored in both the SRAM cells 40 and 42, the present state is a "don't care" state. That is, when data "0" stored in the SRAM cells 40 and 42 is applied to each gate of the comparing transistors Q11 and Q13, the comparing transistors Q11 and Q13 are both deactivated. In this case, a voltage at the match line ML is kept as a high logic level irrespective of the search data applied to the pair of search lines SL1 and /SL1.

When data "1" is stored in both the SRAM cells 40 and 42, the present state is an invalid state, i.e., a write prohibition state.

Generally, in the ternary CAM cell, the SRAM cell 40 side is referred to as a data bit and the SRAM cell 42 side is referred to as a mask bit. This is because the SRAM cell 40 side determines whether stored data match the search data through comparison with the search data and the SRAM cell 42 side determines a don't care state.

The above-described operation of the ternary CAM cell is summarized as in Table 1:

TABLE 1

| D | 0 | 0 | 0 | 0 | 1 | 1 | 1 | 1 |
|---|---|---|---|---|---|---|---|---|
| M | 0 | 0 | 1 | 1 | 0 | 0 | 1 | 1 |
| S | 0 | 1 | 0 | 1 | 0 | 1 | 0 | 1 |
| State | X | X | Mat. | Mis. | Mis. | Mat. | Inv. | Inv. |

In Table 1, D denotes a data bit, M denotes a mask bit, S denotes a search data, X denotes a don't care, Mat. denotes a match, Mis. denotes a mismatch, and Inv. denotes an invalid state.

Figure 3:
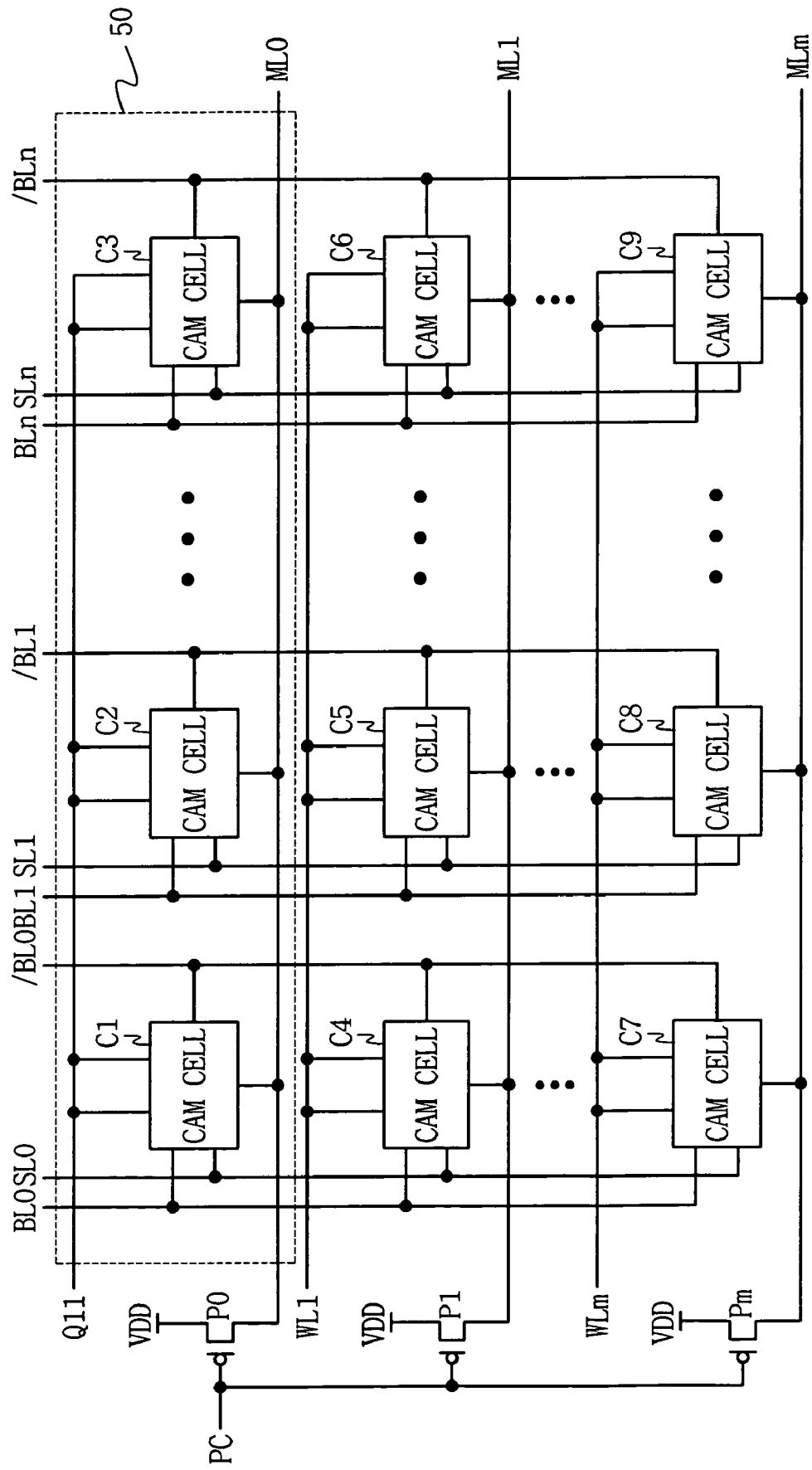
FIG. 3 is a circuit diagram illustrating a cell array in which the CAM cells of FIG. 2 are arranged in a matrix form.

FIG. 3 is a circuit diagram illustrating a cell array in which the CAM cells of FIG. 2 are arranged in a matrix form.

For convenience of illustration, only pairs of bit lines connected to data bits of CAM cells are shown in FIG. 3, and pairs of bit lines connected to mask bits of the CAM cells are not shown. A search line connected to the comparing circuit is indicated only by one line.

Referring to FIG. 3, the bit lines BL0 and /BL0 to BLn and /BLn, word lines WL0 to WLm, match lines ML0 to MLm, and search lines SL0 to SLn are connected to the CAM cells. The bit lines BL0 and /BL0 to BLn and /BLn and the word lines WL0 to WLm intersect, and the match lines ML0 to MLm are parallel with the word lines WL0 to WLm. The search lines SL0 to SLn are parallel with bit lines BL0 and /BL0 to BLn and /BLn.

The word lines WL0 to WLm correspond to rows of the cell array. For example, the word line WL0 is connected to CAM cells C1, C2 and C3 of one row. Similarly, the word line WL1 is connected to CAM cells C4, C5 and C6 of another row, and the word line WLm is connected to CAM cells C7, C8 and C9 of another row.

One of the pairs of the bit lines BL0 and /BL0 to BLn and /BLn corresponds to one column of the cell array. For example, the pair of bit lines BL0 and /BL0 is connected to the CAM cells C1, C4, . . . , C7 of one column. Similarly, the pair of bit lines BL1 and /BL1 is connected to the CAM cells C2, C5, . . . , C8 of another column, and the pair of bit lines BLn and /BLn is connected to CAM cells C3, C6, . . . , C9 of another column.

The match lines ML0 to MLm are connected to CAM cells on corresponding rows in the cell array and to the precharge transistors P0 to Pm. In view of the match lines ML0 to MLm, the CAM cells on one row and one precharge transistor are connected in parallel. For example, the match line ML0 is connected to the CAM cells C1, C2 and C3 and to the precharge transistor P0. Similarly, the match line ML1 is connected to the CAM cells C4, C5 and C6 and to the precharge transistor P1, and the match line MLm is connected to the CAM cells C7, C8 and C9 and to the precharge transistor Pm. Here, the CAM cells connected to one match line form one entry. In other words, the entry is formed of a plurality of CAM cells connected to one word line and one match line.

A searching operation of the CAM cells will be described. When each match line is precharged to a high logic level Vdd by a low precharge signal PC and then the precharge signal PC becomes a high logic state, the precharge transistors P0 to Pm are deactivated so that each match line is floated at the high logic level. Search data is input via a search driver (not shown). When data stored in each of the CAM cells C1 to C9 mismatches the search data input via the search lines SL0 to SLm, the match line of the mismatched entry is discharged. That is, among data stored in the CAM cells connected to the match line of the mismatched entry, since any one bit does not match, the match line of the mismatched entry is at low logic level. On the contrary, when the data stored in each of the CAM cells C1 to C9 matches the search data input via the search lines SL0 to SLm, the match line is not discharged. That is, the match line of the entry having the matching search data is kept at the high logic level. For example, when the data stored in the CAM cells in the entry 50, i.e., the CAM cells C1, C2 and C3 connected to the match line ML0, all mismatch the search data loaded on the search lines SL0, SL1 and SLn respectively connected to the CAM cells C1, C2 and C3, the match line ML0 is discharged to a ground voltage Vss. The same applies to other match lines. The match or mismatch operations for each CAM cell is similar to that described with reference to FIG. 2.

For example, when the entry has 4 bits and search data "1101" is input to the search line and when data stored in the CAM cells in the entry is "1101," the two data match each other. An address, pointer or bit pattern of the entry storing the data "1101" is output as the entry information. When data stored in the entries other than the entry storing the data "1101" are "X101", "1X01", "11X1", . . . , "XXXX", (where, "X" indicates a "don't care" state), the data also match each other. Thus, there may be a plurality of entries having data "1101". Further, there may be a plurality of entries having data in which one or more bits are at a don't care state and bits other than the don't care state bits exhibit data match. Accordingly, a plurality of entries having data matching the search data may exist. In this case, according to a prescribed priority, e.g., when a lower address has a priority, data of an entry having the lower address among entries having the match data is output as the encoder information by the encoder. As described above, the signal generated and output by the encoder may be in an address form, a pointer form, or a bit pattern form.

Figure 4:
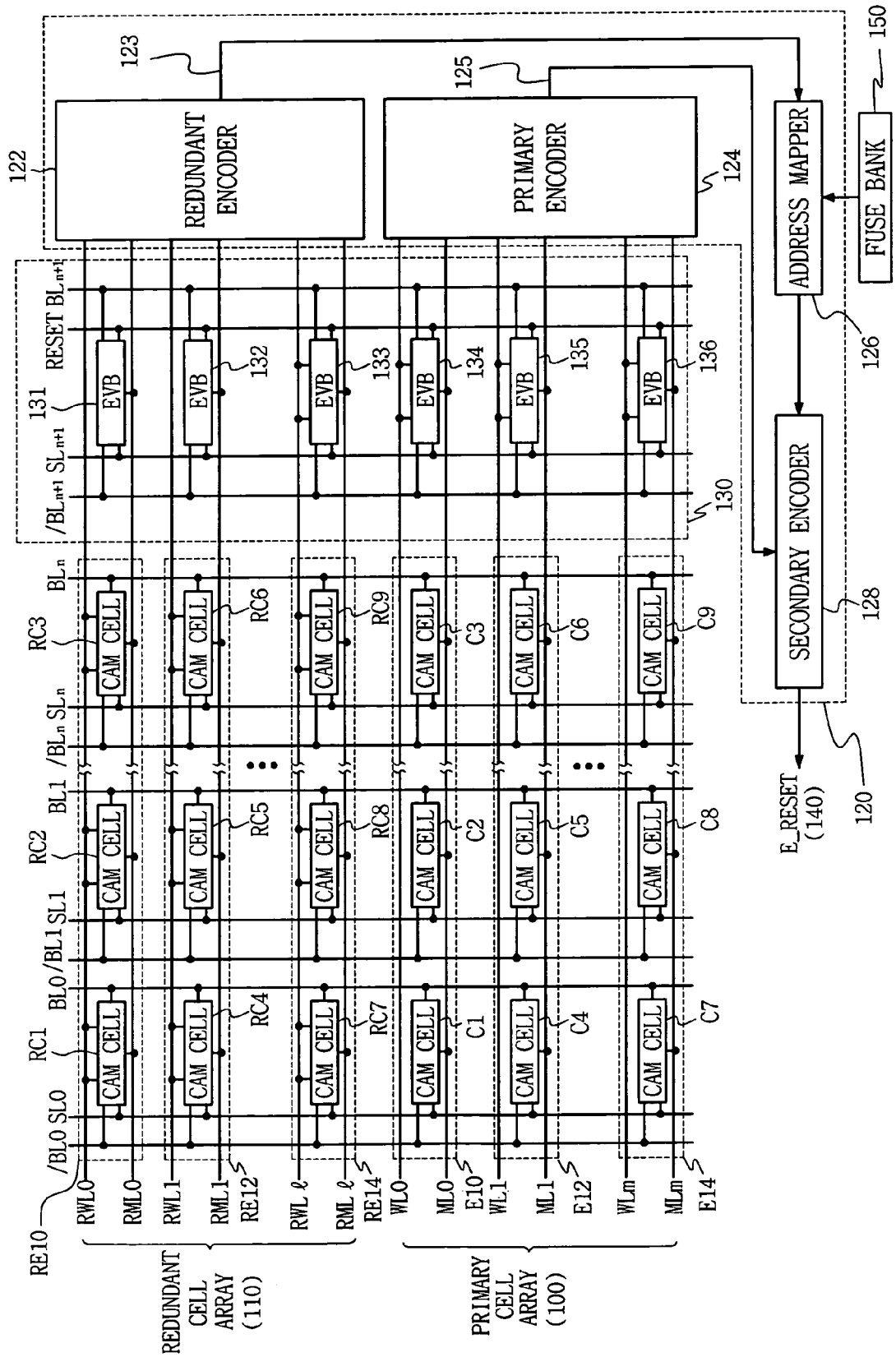
FIG. 4 is a circuit diagram illustrating a CAM device according to an embodiment of the present invention.

FIG. 4 is a circuit diagram illustrating a CAM device according to an embodiment of the present invention.

Referring to FIG. 4, the CAM device includes a primary cell array 100 as a first cell array, a redundant cell array 110 as a second cell array, an encoder 120, and an entry controlling circuit 130.

The primary cell array 100 includes one or more entries E10, E12 and E14. The entries E10, E12 and E14 include a plurality of CAM cells C1 to C9 for storing data connected to word lines WL0, WL1, . . . , WLm and match lines ML0, ML1, . . . , MLm. For example, the entry E10 includes CAM cells C1, C2 and C3 connected to the word line WL0 and the match line ML0. Similarly, the entry E12 includes the CAM cells C4, C5 and C6 connected to the word line WL1 and the match line ML1, and the entry E14 includes the CAM cells C7, C8 and C9 connected to the word line WLm and the match line MLm. Pairs of bit lines BL0 and /BL0 to BLn and /BLn intersect with the word lines WL0 to WLm and connected to the CAM cells C1 to C9, respectively.

The redundant cell array 110 is used for repairing. That is, the redundant cell array 110 is used to substitute for an entry including one or more defective CAM cells (hereinafter, referred to as "defective entry") in the primary cell array 100. Preferably, entries RE10, RE12 and RE14 in the redundant cell array 110 have the same structure as that of the entries in the primary cell array 100 (e.g., both have the same number of CAM cells connected to the match line and the word line). For example, when one CAM cell C1 in the entry E10 is defective, the entry RE10 in the redundant cell array 110 is substituted for the entry E10.

In a search operation mode, the encoder 120 receives a signal from an entry having data matching the search data to generate final entry information E_RESULT 140. That is, a signal on the match line in the entry having data matching the search data (hereinafter, referred to as "match signal") is input to the encoder 120 and is used to generate the final entry information 140 at the encoder 120. The match signal may be a high voltage (e.g., Vdd).

The encoder 120 may include a primary encoder 124 as a first encoder and a redundant encoder 122 as a second encoder.

The primary encoder 124 receives a match signal from the entry in the primary cell array 100 having data matching the search data to generate first entry information. When there are two or more entries having the match data in the primary cell array 100 (hereinafter, referred to as "match entries"), the primary encoder 124 receives a match signal from a match entry having a higher priority according a defined entry priority and generates the first entry information.

The redundant encoder 122 receives a match signal from an entry in the redundant cell array 110 having data matching the search data to generate second entry information. Similar to the primary encoder 124, when there are two or more match entries in the redundant cell array 110, the redundant encoder 122 receives a match signal from a match entry having a higher priority according a defined entry priority and generates the second entry information. As previously described, the match entry in the redundant cell array 110 is an entry substituting for the defective entry.

The encoder 120 may further include an address mapper 126 for converting the second entry information to information designating the defective entry. That is, the address mapper 126 converts the second entry information generated by the redundant encoder 122 and received via a redundant entry information bus 123 to the information designating the defective entry. For example, the information designating the defective entry may be the first entry information generated by the primary encoder 124 by inputting the match signal from the defective entry to the primary encoder 124 when it is assumed that the defective entry normally operates.

The encoder 120 may further include a secondary encoder 128 for receiving the first entry information and the converted information from the address mapper to generate the final entry information. That is, the secondary encoder 128 receives the first entry information from the primary encoder and the converted information from the address mapper (e.g., entry information of the defective entry) to output entry information as the final entry information 140 having a higher priority according a defined entry priority. If only one of the first entry information and the second entry information is generated, the secondary encoder 128 outputs only such entry information as the final entry information 140. The first entry information is input to the secondary encoder 128 via the primary entry information bus 125, and the second entry information is input to the redundant encoder 122 via the redundant entry information bus 123.

The entry controlling circuit 130 determines whether each entry in the primary cell array 100 and the redundant cell array 110 is used to generate the final entry information 140 at the encoder 120, and blocks a signal from the defective entry from participating in generating the final entry information at the encoder 120. The entry controlling circuit 130 may include control cells EVB each assigned to each entry in the primary cell array 100 and the redundant cell array 110. Here, since the control cell EVB also serves as an entry valid bit having a conventional function of determining whether an entry is used, it is named as "EVB" indicating the entry valid bit for convenience.

Figure 5:
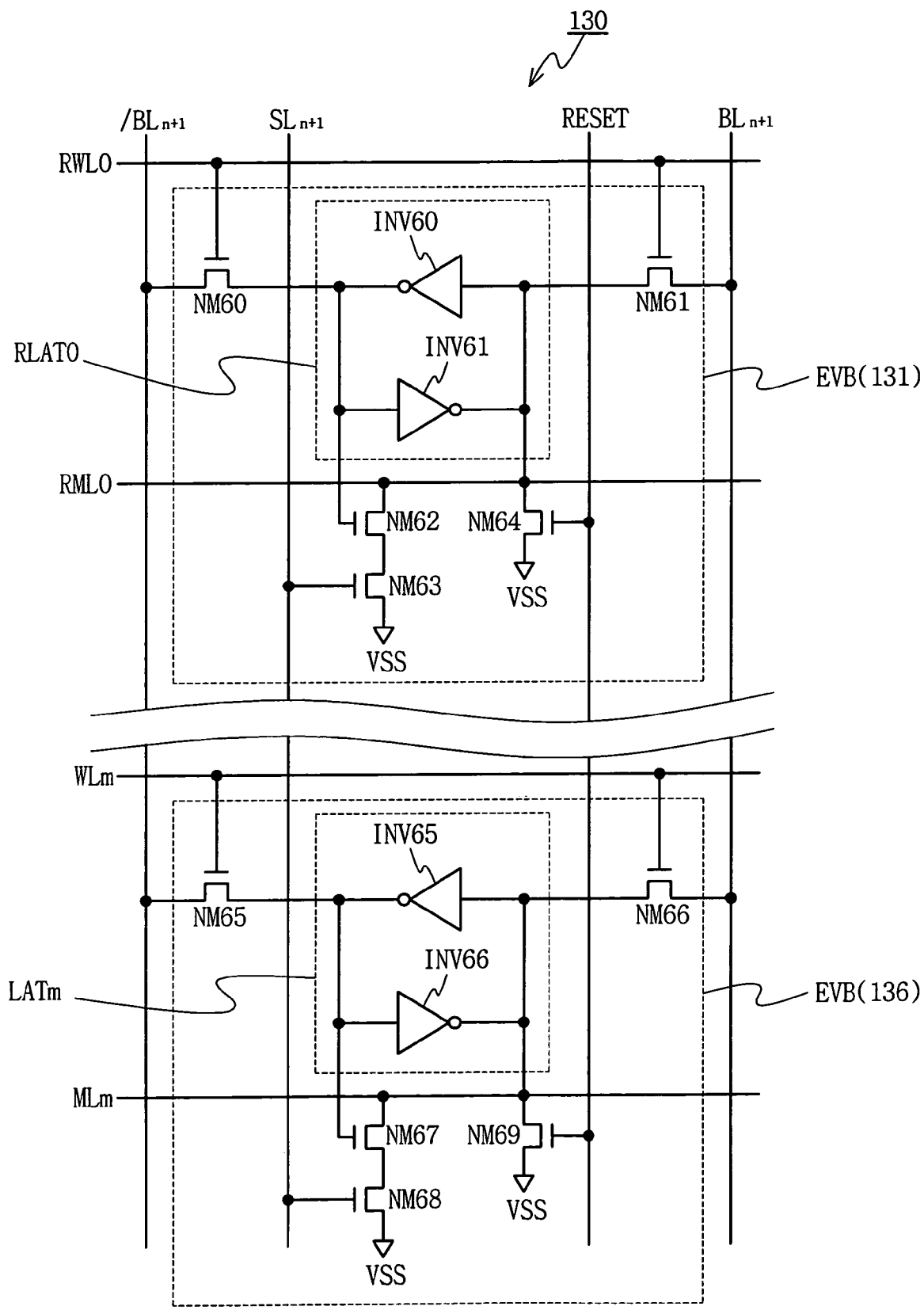
FIG. 5 is a circuit diagram illustrating an example of an entry controlling circuit in FIG. 4.

More detailed circuit of the entry controlling circuit 130 will be now described with reference to FIG. 5. FIG. 5 is a circuit diagram illustrating an example of an entry controlling circuit in FIG. 4. Referring to FIG. 5, the entry controlling circuit 130 includes a reset enable signal line SLn+1, a pair of bit lines BLn+1 and /BLn+1, a reset signal line RESET, and a plurality of control cells EVB.

The reset enable signal line SLn+1 is used to receive a reset enable signal that enables a match line to be reset by a combination of a reset signal input via the reset signal line RESET with data programmed in a latch of the control cell EVB.

The pair of bit lines BLn+1 and /BLn+1 is for receiving entry select data that is a signal for determining whether each entry in the primary cell array (100 of FIG. 4) and the redundant cell array (110 of FIG. 4) is used to generate the final entry information (140 of FIG. 4) at the encoder (120 of FIG. 4), so that the plurality of control cells EVB are programmed.

The reset signal line RESET is for applying a reset signal that enables the match line of each entry in the primary cell array (100 of FIG. 4) and the redundant cell array (110 of FIG. 4) to be reset.

Since the control cells EVB have the same structure, only one (control cell 131 including a latch RLAT0) of the plurality of control cells EVB will be now described by way of example. The control cell 131 includes a latch RLAT0, access transistors NM60 and NM61, and reset transistors NM62, NM63 and NM64.

The latch RLAT0 stores the entry select data for determining whether each entry in the primary cell array (100 of FIG. 4) and the redundant cell array (110 of FIG. 4) is used to generate the final entry information 140 at the encoder (120 of FIG. 4).

The access transistors NM60 and NM61 deliver a signal for programming to store data in the latch RLAT0, i.e., a signal for programming the control cell 131, to the latch RLAT0 when the signal for programming is applied to the pair of bit lines BLn+1 and /BLn+1. Since the gates of the access transistors NM60 and NM61 are connected to the word line RWL0, the access transistors NM60 and NM61 are activated and the signal for programming is delivered to the latch RLAT0 when a high logic signal is applied to the word line RWL0. A determination is made as to whether each entry in the primary cell array (100 of FIG. 4) and the redundant cell array (110 of FIG. 4) is used to generate the final entry information (140 of FIG. 4) at the encoder (120 of FIG. 4).

Operation of the entry controlling circuit 130 will be described. For example, when a low logic signal, i.e., data "0", is applied via the reset enable signal line, a reset transistor NM63 is deactivated and the match line RML0 becomes a floating state to be not affected by the entry controlling circuit 130. Since the floating state only means that the match line RML0 is floated when viewed from the latch RLAT0 of the entry controlling circuit 130. Strictly speaking, the match line RML0 may not be floated since it is actually connected to other portions. The floating state cited herein has such a meaning.

On the contrary, when data "1" is applied via the reset enable signal line, the reset transistor NM63 is activated. A reset transistor NM64 is deactivated when data "0" is applied to the reset signal line RESET. When data "0" is applied to the bit line BLn+1 of the latch RLAT0, data "1" is applied to the gate of the reset transistor NM62 and the reset transistor NM62 is activated. Accordingly, the match line RML0 is discharged to the ground voltage Vss. In this case, the entry including the control cell EVB selected by the word lines RWL0 to MLm is not used to generate the final entry information (140 of FIG. 4) at the encoder (120 of FIG. 4). Thus, a determination is made as to whether a specific entry in the CAM device is used or not.

Meanwhile, data "1" is applied to the reset enable signal line so that the reset transistor NM63 is activated, and data "0" is applied to the reset signal line RESET so that the reset transistor NM64 is deactivated. When the bit line BLn+1 of the latch RLAT0 is at "1," the reset transistor NM62 is deactivated and the match line RML0 becomes a floating state to be not affected by the entry controlling circuit 130.

When logic "1" is applied to the reset enable signal line so that the reset transistor NM63 is activated and a logic "1" is applied to the reset signal line RESET so that the reset transistor NM64 is activated, the reset transistor NM62 is activated irrespective of the data programmed in the latch RLAT0. Accordingly, the match line RML0 is discharged to the ground voltage Vss.

Operation of the entry controlling circuit 130 is summarized in as Table 2:

TABLE 2

| | | | | |
|---|---|---|---|---|
| SLn + 1 | 0 | 1 | 1 | 1 |
| RESET | X | 0 | 0 | 1 |
| RLAT0 | X | 0 | 1 | X |
| RML0 | F | 0 | F | RES |

In Table 2, the match line RML0 participates in generating the final entry information (140 of FIG. 4) at the encoder (120 of FIG. 4) when the match line RML0 is at "F." The match line RML0 does not participate in generation the final entry information (140 of FIG. 4) when it is at logic "0." The match line RML0 is at a reset state when it is at "RES". That is, logic "1" should be always applied to the reset enable signal line SLn+1 for the match line RML0 to be at the reset state.

When logic "1" is applied to the reset enable signal line SLn+1 and, at this time, logic "1" is applied to the reset signal line RESET, the match line RML0 becomes the reset state.

Accordingly, the match lines of all the entries in the primary cell array (100 of FIG. 4) become the reset state. Of course, the match lines of the defective entries become the reset state.

Thereafter, in the CAM device, search data is applied to the search signal line. Data comparison operation is performed on entries in the primary cell array (100 of FIG. 4) and the redundant cell array (110 of FIG. 4), and then a result of the data comparison operation is applied to the match line. Here, the match line of the defective entry is kept at the reset state. Thus, even though the defective entry stores the data matching the search data due to the latch characteristic of the CAM cell, the match line of the defective entry is always kept at the reset state (e.g., having the ground voltage Vss). Accordingly, the signal applied from the defective entry to the encoder (120 of FIG. 4) does not participate in generating the final entry information (140 of FIG. 4) at the encoder (120 of FIG. 4).

Further, the CAM device may further include a redundant encoder enabling unit (not shown in FIG. 4. See 260 of FIG. 6) for enabling the second encoder when the entries in the redundant cell array (110 of FIG. 4) is substituted for one or more of the entries in the primary cell array (100 of FIG. 4). With the redundant encoder enabling unit, unnecessary power consumption in the redundant cell array (110 of FIG. 4) can be reduced when defective entries do not exist in the primary cell array (100 of FIG. 4), i.e., when the redundant cell array (110 of FIG. 4) is not used.

Figure 6:
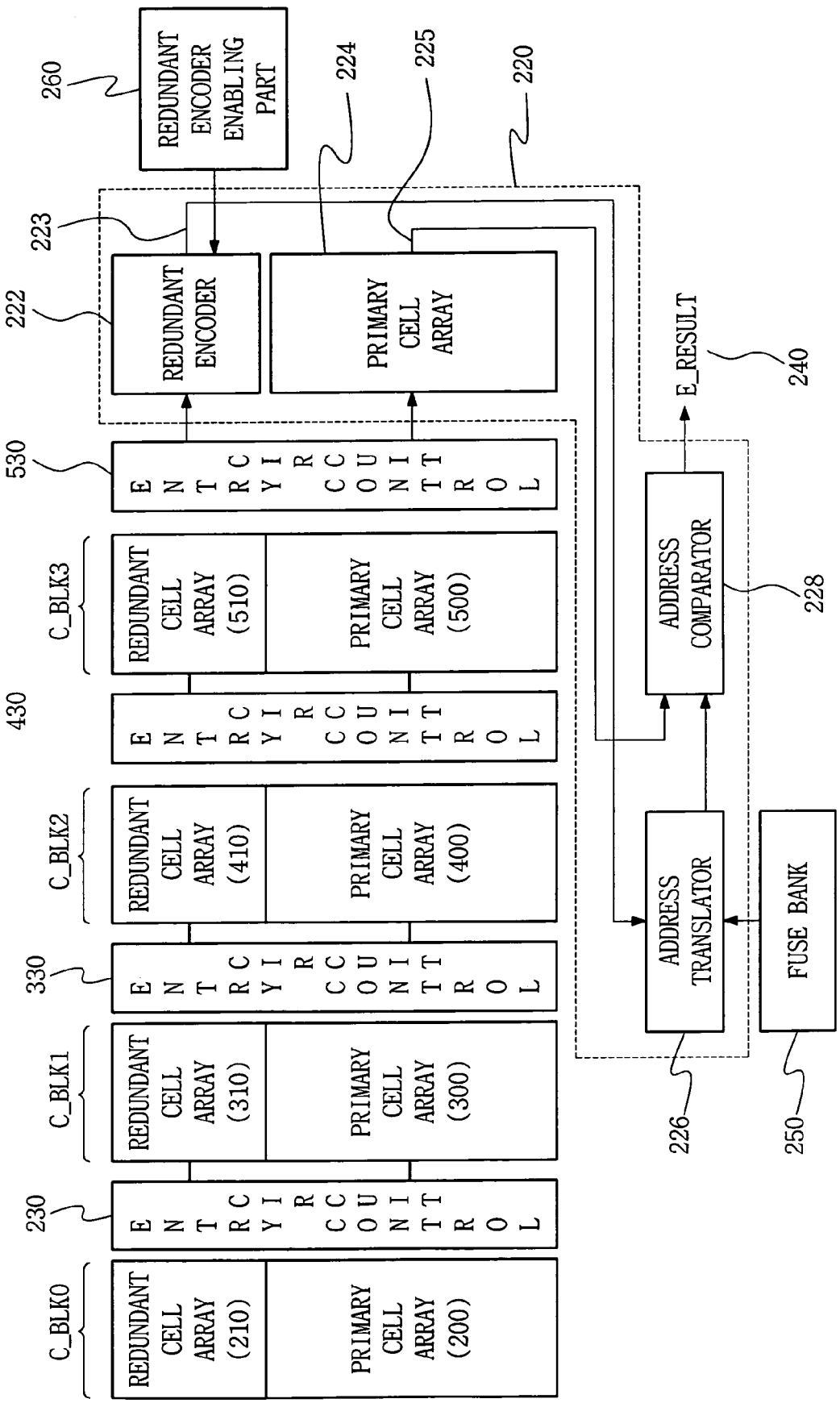
FIG. 6 is a block diagram illustrating a CAM device according to another embodiment of the present invention.

Meanwhile, there is a desire for a CAM device capable of supporting functions of extending a bit width, i.e., a search width of data to be searched, and adjusting the search width (variability of the search width). This is because the extended search width and the variable search width are required when IPv6 is used as a future IP system. The CAM device having such extended, variable search width employs an entry controlling circuit. Such a CAM device will be now described with reference to FIG. 6. FIG. 6 is a block diagram illustrating a CAM device according to an embodiment of the present invention. Referring to FIG. 6, the CAM device includes one or more CAM array block C_BLK0, C_BLK1, C_BLK2 and C_BLK3, an encoder 220, and entry controlling circuits 230, 232, 234 and 236.

Each of the CAM array blocks C_BLK0, C_BLK1, C_BLK2 and C_BLK3 includes primary cell arrays 200, 300, 400 and 500 and redundant cell arrays 210, 310, 410 and 510.

Each of the primary cell arrays 200, 300, 400 and 500 includes at least one entry in which a plurality of CAM cells (not shown). For example, the ternary CAM cells (as shown in FIG. 2) are connected to word lines (not shown) and match lines (not shown).

Each of the redundant cell arrays 210, 310, 410 and 510 includes at least one entry formed in the same structure as that of each entry in the primary cell arrays 200, 300, 400 and 500. When one or more of the entries in the primary cell arrays 200, 300, 400 and 500 are defective, the defective entries are substituted for the entries of the redundant cell arrays 210, 310, 410 and 510.

The encoder 220 receives a match signal from the entry of the CAM array blocks C_BLK0 to C_BLK3 having data matching the search data to generate final entry information E_RESULT 260. The encoder 220 includes a redundant encoder 222, a primary encoder 224, an address translator 226, and an address comparator 228. The redundant encoder 222 and the primary encoder 224 have a function similar to those described above with reference to FIG. 4 except that they have an increased number of bits. The address translator 226 has a function similar to that of the address mapper (126 of FIG. 4), and the address comparator 228 has a similar function to that of the secondary encoder (128 of FIG. 4). The operation of the address translator 226 and the address comparator 228 is similar to that described with reference to FIG. 4.

Each of the entry controlling circuits 230, 330, 430 and 530 determines whether each entry in the CAM array blocks C_BLK0 to C_BLK3 is used to generate the final entry information at the encoder 220, and inhibits the signal received from the defective entry from participating in generating the final entry information 240 at the encoder 220. The configuration and operation of the entry controlling circuits 230, 330, 430 and 530 are similar to those described above with reference to FIG. 4.

While the CAM device including the four CAM array blocks C_BLK0 to C_BLK3 is shown by way of example in FIG. 6, the CAM device preferably includes two or more CAM array blocks. For example, when, in the CAM array block C_BLK0, an entry in the primary cell array 200 has 4 bits and the CAM device has two CAM array blocks C_BLK0 and C_BLK1, the CAM device has an 8-bit search width. When the CAM device includes the four CAM array blocks C_BLK0 to C_BLK3, its search width becomes 16 bits.

Further, when the CAM device includes the four CAM array blocks C_BLK0 to C_BLK3, it includes entry controlling circuits 230, 330, 430 and 530 for a specific entry of a specific CAM array block not to be used. Accordingly, the CAM device can perform the search function when the search width is 12 bits, 8 bits, and 4 bits, as well as 16 bits.

A method for repairing the CAM device as shown in FIGS. 4 and 6 may include substituting an entry in a redundant cell array for an entry including defective CAM cells (e.g., a defective entry), applying a reset signal to each entry in the primary and redundant cell arrays prior to applying search data to the CAM device, and allowing a signal on a match line of an entry other than the defective entry to participate in generating the final entry information at the encoder after applying the reset signal. Here, the process of applying the reset signal is for inhibiting the signal on the match line of the defective entry from participating in generating the final entry information at the encoder.

The method may further include determining whether each entry in the primary and redundant cell arrays is used to generate the final entry information at the encoder. This is for allowing each entry in the primary and redundant cell arrays to be selectively used.

The process of applying the reset signal may further include making the match line of each entry at a ground voltage. This is for inhibiting CAM cells of the defective entry in the primary cell array from participating in generating the final entry information at the encoder even though the CAM cells store information having any state.

As described above, with an enhanced CAM device and a method for repairing the CAM device according to an embodiment of the present invention, it is possible to mitigate or minimize difficulties caused by the latch structure of the cell in the primary cell array.

According to at least one embodiment of the present invention, the entry substituted by a redundant entry is inhibited, i.e., the defective entry, from participating in generating the final entry information. For example, in the search operation, when externally input search data matches data having a specific pattern of the defective entry, it is possible to inhibit the defective entry from participating in generating the entry information at the primary encoder.

It is also possible to inhibit the defective entry from participating in generating the entry information at the primary encoder when an entry in a redundant cell array is substituted for a defective entry and the entry valid bit is programmed to indicate that the entry in the redundant cell array substituting for the defective entry is valid.

The invention has been described using exemplary embodiments. However, it is to be understood that the scope of the invention is not limited to the disclosed embodiments. The scope of the invention is intended to include various modifications and alternative arrangements within the capabilities of persons skilled in the art using presently known or future technologies and equivalents.

What is claimed is:

1. A content addressable memory (CAM) device comprising:
   a first cell array having at least one entry in which a plurality of CAM cells is connected to word lines and match lines;
   a second cell array having entries formed in the same structure as that of the entries in the first cell array to substitute for entries including one or more defective CAM cells in the first cell array;
   an encoder for receiving match signals from entries having data matching search data to generate final entry information in a search operation; and
   an entry controlling circuit for determining whether each entry in the first and second cell arrays is used to generate the final entry information at the encoder, and inhibiting signals applied from match lines of the entries including the defective CAM cells from participating in generating the final entry information at the encoder.

2. The device according to claim 1, wherein the encoder comprises:
   a first encoder for receiving the match signals from the match entries in the first cell array having the data matching the search data to generate first entry information; and a second encoder for receiving match signals from the match entries in the second cell array having data matching the search data to generate second entry information.

3. The device according to claim 2, wherein the first and second encoders respectively generate the first and second entry information based on the match signal from the entry having a higher priority according to a defined entry priority when two or more match entries exist in the first and second cell arrays.

4. The device according to claim 3, wherein the encoder comprises:
an address mapper for converting the second entry information to information designating the entries including the defective CAM cells; and
a secondary encoder for receiving converted information from the address mapper and the first entry information to generate the final entry information.

5. The device according to claim 1, wherein the entry controlling circuit comprises control cells each assigned to each entry in the first and second cell arrays, and the control cell comprises a latch that stores entry select data for determining whether the entries in the first and second cell arrays are used to generate the entry information at the encoder.

6. The device according to claim 5, wherein the entry controlling circuit comprises a bit line for applying the entry select data.

7. The device according to claim 6, wherein the entry controlling circuit comprises a reset signal line that enables the entries in the first and second cell arrays to be reset.

8. The device according to claim 7, wherein the reset state is where the match line of the entry becomes a ground voltage level.

9. The device according to claim 8, wherein the CAM device comprises a redundant encoder enabling unit for enabling the second encoder when the entries in the second cell array are substituted for one or more entries in the first cell array.

10. A CAM device comprising:
a CAM array block including a primary cell array having at least one entry in which a plurality of CAM cells are connected to word lines and match lines, and a redundant cell array having entries formed in the same structure as that of the entries in the primary cell array to substitute for entries including one or more defective CAM cells in the primary cell array;
an encoder for receiving a match signal from an entry in the CAM array block having data matching search data to generate final entry information; and
an entry controlling circuit for determining whether each entry in the CAM array block is used to generate the final entry information at the encoder, and inhibiting a signal applied from a match line of the defective entry from participating in generating the final entry information at the encoder.

11. The device according to claim 10, wherein the CAM array block comprises two or more CAM array blocks.

12. The device according to claim 11, wherein the entry controlling circuit comprises control cells each assigned to each entry in the CAM array block, and the control cell comprises a latch that stores entry select data for determining whether the entries in the CAM array block are used to generate the entry information at the encoder.

13. The device according to claim 12, wherein the entry controlling circuit comprises a bit line for applying the entry select data.

14. The device according to claim 13, wherein the entry controlling circuit comprises a reset signal line for enabling the entries in the CAM array block to be reset.

15. The device according to claim 14, wherein the reset state is where the match line of the entry becomes a ground voltage level.

16. The device according to claim 15, further comprising a redundant encoder enabling unit for enabling the second encoder when the entries in the redundant cell array are substituted for one or more of the entries in the primary cell array.

17. The device according to claim 16, wherein after search data is applied to a search signal line and a data comparison operation is performed on the entries in the CAM array block and before a result of the data comparison operation is applied to the match line, the match line becomes a ground voltage level in response to a reset signal applied to the control cell.

18. A method for repairing a CAM device, the CAM device comprising a primary cell array having at least one entry in which a plurality of CAM cells are connected to word lines and match lines, a redundant cell array including entries having the same structure as that of the entries in the primary cell array to substitute for an entry including one or more defective CAM cells in the primary cell array, and an encoder, the method comprising:
substituting an entry in the redundant cell array for the entry including the defective CAM cells;
applying a reset signal to each entry in the primary and redundant cell arrays prior to applying search data to the CAM device to inhibit a signal on a match line of the entry including the defective CAM cells from participating in generating final entry information at the encoder; and
allowing signals on match lines of entries other than the entry including defective CAM cells to participate in generating the final entry information at the encoder.

19. The method according to claim 18, further comprising determining whether each entry in the primary and redundant cell arrays is used to generate the final entry information at the encoder.

20. The method according to claim 19, wherein the step of applying a reset signal comprises making a match line of each entry at a ground voltage.

* * * * *